(12) United States Patent
Swanson

(10) Patent No.: US 9,264,054 B1
(45) Date of Patent: Feb. 16, 2016

(54) DLL LOCK DETECTOR

(71) Applicant: Marvell International Ltd., Hamilton (BM)

(72) Inventor: Ross Swanson, Lyons, CO (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 14/607,856

(22) Filed: Jan. 28, 2015

Related U.S. Application Data

(60) Provisional application No. 61/933,739, filed on Jan. 30, 2014.

(51) Int. Cl.
*H03L 7/06* (2006.01)
*H03L 7/095* (2006.01)

(52) U.S. Cl.
CPC .................................. *H03L 7/095* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 6,055,280 A * | 4/2000 | Genrich | .............. | H04L 27/2273 329/308 |
| 6,794,944 B2 * | 9/2004 | Hirai | ..................... | H03L 7/0891 331/1 A |
| 6,970,047 B1 * | 11/2005 | Johnson | ............. | H03K 5/15013 327/156 |
| 2008/0080603 A1 * | 4/2008 | Bunce | ............... | G06F 17/30985 375/224 |
| 2009/0284318 A1 * | 11/2009 | Machado | ................ | H03L 7/197 331/16 |
| 2015/0061906 A1 * | 3/2015 | Luu | ..................... | H03M 1/1205 341/122 |

* cited by examiner

*Primary Examiner* — Adam Houston

(57) ABSTRACT

An apparatus includes a lock detect circuit configured to receive a phase detect signal and generate a lock signal according to the phase detect signal. The phase detect signal is a single bit signal having a first value or a second value. A method includes receiving a phase detect signal using a lock detect circuit, and generating a lock signal according to the phase detect signal. The phase detect signal is a single bit signal having a first value or a second value.

17 Claims, 3 Drawing Sheets

DLL LOCK DETECTOR

CROSS REFERENCE TO RELATED APPLICATION

This present disclosure claims the benefit of U.S. Provisional Application No. 61/933,739, filed on Jan. 30, 2014, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A Delay-Locked Loop (DLL) is a circuit that produces an output signal having a specified phase relationship with an input signal. For example, the DLL may be used to produce the output signal having a transition occurring at a delay from a transition of the input signal equal to a quarter, a half, or three-quarters of a clock period of the input signal. The input signal can be a clock signal.

The DLL includes one or more variable delay line circuits that are used to generate the output signal by delaying the input signal. The delay produced by the one or more delay line circuits is controlled according to a phase detect signal produced by a phase detect circuit.

The DLL also includes a lock detect circuit that produces a lock signal. The lock signal has a first value when the phase relationship of the output signal to the input signal is within an error margin of the specified phase relationship, and a second value otherwise. The DLL is considered locked when the lock signal has the first value, and unlocked when the lock signal has the second value. A circuit may use the lock signal to determine whether to perform an operation that uses the output signal, for example, receiving or sending data using the output signal as a strobe signal.

SUMMARY

In an embodiment, an apparatus includes a lock detect circuit configured to receive a phase detect signal and generate a lock signal according to the phase detect signal.

In an embodiment, the phase detect signal is a single bit signal having a first value or a second value.

In an embodiment, the lock detect circuit receives a clock signal and generates the lock signal according to a count of a number of clock cycles of the clock signal since a most recent change in a value of the phase detect signal.

In an embodiment, the lock detect circuit generates the lock signal having a first value when the count of the number of clock cycles is less than a threshold value, and generates the lock signal having a second value when the count of the number of clock cycles is greater than or equal to the threshold value.

In an embodiment, the threshold value is programmable.

In an embodiment, the lock detect circuit includes a trend counter configured to receive a clock signal and generate a trend count signal using the clock signal, and a comparator configured to receive the trend count signal, perform a comparison of a value of the trend count signal to a threshold value, and generate a break signal according to the comparison. The lock detect circuit also includes a finite state machine configured to receive the phase detect signal and the break signal, generate a lock signal and control the trend counter according to the phase detect signal and the break signal.

In an embodiment, the value of the trend count signal corresponds to a count of a number of clock cycles of the clock signal since a most recent change in a value of the phase detect signal.

In an embodiment, the trend counter is a one, two, or three bit counter.

In an embodiment, the apparatus further includes a phase detect circuit of a delay locked loop (DLL) circuit configured to generate the phase detect signal.

In an embodiment, the lock detect circuit is or is provided in an integrated circuit.

In an embodiment, a method includes receiving a phase detect signal using a lock detect circuit, and generating a lock signal according to the phase detect signal.

In an embodiment, the phase detect signal is a single bit signal having a first value or a second value.

In an embodiment, the method further includes receiving a clock signal using the lock detect circuit and generating the lock signal according to a count of a number of clock cycles of the clock signal since a most recent change in a value of the phase detect signal.

In an embodiment, the method further includes generating the lock signal having a first value when the count of the number of clock cycles is less than a threshold value, and generating the lock signal having a second value when the count of the number of clock cycles is greater than or equal to the threshold value.

In an embodiment, the method further includes receiving the threshold value, and the threshold value is programmable.

In an embodiment, the method further includes receiving a clock signal, and generating a trend count signal according to the clock signal, the phase detect signal, and a break signal. The method further includes performing a comparison of a value of the trend count signal to a threshold value, generating the break signal according to the comparison, and generating the lock signal according to the phase detect signal and the break signal.

In an embodiment, the value of the trend count signal corresponds to a count of a number of clock cycles of the clock signal since a most recent change in a value of the phase detect signal.

In an embodiment, the trend counter signal is generated using a one, two, or three bit counter.

In an embodiment, the method further includes receiving the phase detect signal from a phase detect circuit of a delay locked loop (DLL) circuit.

DETAILED DESCRIPTION

Figure 1:
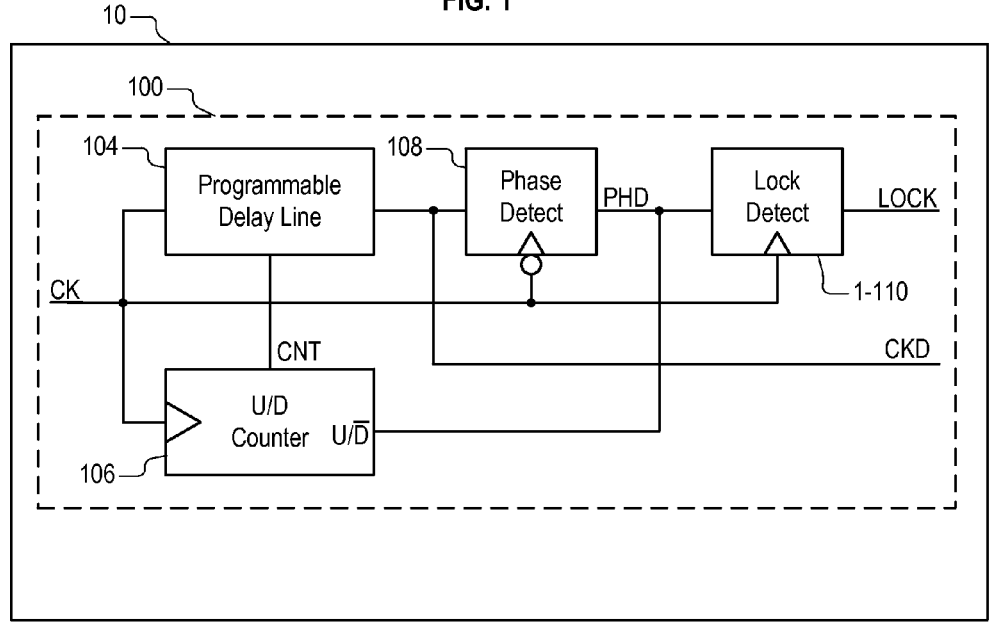
FIG. 1 is a block diagram of an electronic system including a Delay Locked Loop (DLL) according to an embodiment.

FIG. 1 is a block diagram of an electronic system 10 including a Delay Locked Loop (DLL) 100 according to an embodiment. The DLL 100 includes a programmable Delay Line circuit (DL) 104, an up/down counter 106, a Phase Detect Circuit (PDC) 108, and a lock detect circuit 1-110.

The DLL 100 receives a clock signal CK which is distributed to an input of the DL 104, a clock input of the counter 106, a clock input of the PDC 108, and a clock input of the lock detect circuit 1-110. The DLL 100 produces a delayed clock signal CKD and a lock signal LOCK.

The DL 104 generates the delayed clock signal CKD by delaying the clock signal CK by a delay amount determined according to a value of a count signal CNT. In an embodiment, the DL 104 is configured to increase the delay amount when the value of the count signal CNT increases, and decrease the delay amount when the value of the count signal CNT decreases.

The PDC 108 generates a phase detect signal PHD according to the delayed clock signal CKD and the clock signal CK.

The counter 106 generates the count signal CNT according to the input clock CK and the phase detect signal PHD. The counter 106 increments the value of the count signal CNT when a transition of the clock signal CK occurs and the phase detect signal PHD has a first value, and decrements the value of the count signal CNT when the transition of the clock signal CK occurs and the phase detect signal PHD has a second value.

A person of skill in the art in light of the teachings and disclosures herein would be aware of a variety of circuits capable of functioning as the DL 106, the PDC 108, and the counter 106, respectively.

Figure 2:
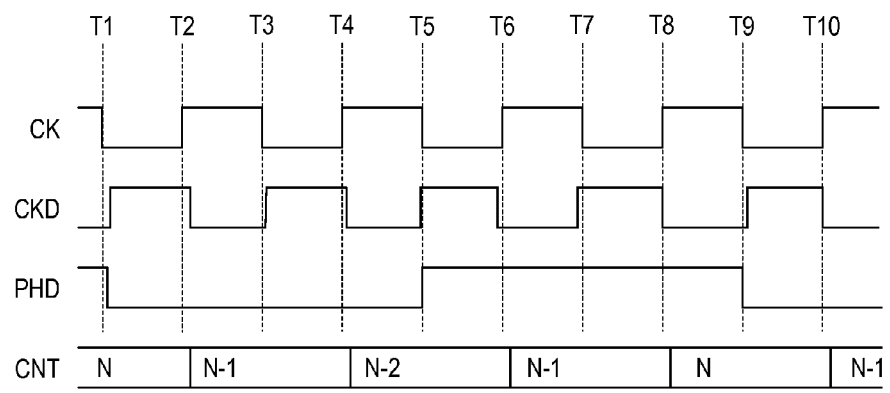
FIG. 2 is a waveform diagram illustrating operations of the DLL of FIG. 1 according to an embodiment.

FIG. 2 is a waveform diagram illustrating operations of the DLL 100 of FIG. 1 according to an embodiment. In particular, FIG. 2 illustrates the operation of the DL 104, the PDC 108, and the counter 106.

At a first time T1 corresponding to a first negative transition (also called a falling edge) of the clock signal CK, the value of the count signal CNT is a value N. The DL 104 produces the delayed clock signal CKD by delaying the clock signal CK by a delay corresponding to the value N.

The PDC 108 generates the phase detect signal PHD by sampling the delayed clock signal CKD using the first negative transition of the clock signal CK. Because the delayed clock signal CKD has a low value at the first time T1, the PDC 108 generates the phase detect signal PHD having a low value.

At a second time T2 corresponding to a first positive transition (also called a rising edge) of the clock signal CK, the counter 106 receives the phase detect signal PHD and updates the value of the count signal CNT according to the value of the phase detect signal PHD. Because the value of the phase detect signal PHD is the low value, the counter 106 decreases the value of the count signal CNT by one to the value N−1, that is, the counter 106 decrements the count signal CNT.

At a third time T3 corresponding to a second negative transition of the clock signal CK, the value of the count signal CNT is a value N−1. The DL 104 is producing the delayed clock signal CKD by delaying the clock signal CK by a delay corresponding to the value N−1 of the count signal CNT. Because the value of the count signal CNT at the third time T3 is less than the value of the count signal CNT at the first time T1, the DL 104 delays the delayed clock signal CKD less at the third time T3 than at the first time T1.

The PDC 108 generates the phase detect signal PHD by sampling the delayed clock signal CKD using the second negative transition of the clock signal CK, thereby generating the phase detect signal PHD having the low value.

At a fourth time T4 corresponding to a second positive transition of the clock signal CK, because the value of the phase detect signal PHD is the low value, the counter 106 decreases the value of the count signal CNT by one to the value N−2.

At a fifth time T5 corresponding to a third negative transition of the clock signal CK, the DL 104 is producing the delayed clock signal CKD by delaying the clock signal CK by a delay corresponding to the value N−2 of the count signal CNT.

The PDC 108 generates the phase detect signal PHD by sampling the delayed clock signal CKD using the third negative transition of the clock signal CK. Because the delayed clock signal CKD is delayed less at the fifth time T5 than it was at the first and third times T1 and T3, the value of the delayed clock signal CKD at the fifth time T5 is now high, and as a result the PDC 108 generates the phase detect signal PHD having a high value.

At a sixth time T6 corresponding to a third positive transition of the clock signal CK, because the value of the phase detect signal PHD is the high value, the counter 106 increases the value of the count signal CNT by one to the value N−1, that is, the counter 106 increments the count signal CNT.

The operations described above as occurring at first, third and fifth times T1, T3, and T5 are repeated at subsequent negative transitions of the clock signal CK, and the operations described above as occurring at second, fourth, and sixth times T2, T4, and T6 are repeated at subsequent positive transitions of the clock signal CK.

Thus, at a seventh time T7 corresponding to a fourth negative transition of the clock signal CK, the DL 104 is producing the delayed clock signal CKD by delaying the clock signal CK by a delay corresponding to the value N−1 of the count signal CNT, and the PDC 108 generates the phase detect signal PHD having the high value. At an eighth time T8 corresponding to a fourth positive transition of the clock signal CK, because the value of the phase detect signal PHD is the high value, the counter 106 increments the count signal CNT.

At a ninth time T9 corresponding to a fifth negative transition of the clock signal CK, the DL 104 is producing the delayed clock signal CKD by delaying the clock signal CK by a delay corresponding to the value N of the count signal CNT, and the PDC 108 generates the phase detect signal PHD having the low value. At a tenth time T10 corresponding to a fifth positive transition of the clock signal CK, because the value of the phase detect signal PHD is the low value, the counter 106 decrements the count signal CNT.

By repeating the above described operations, the closed loop circuit including the DL 104, the counter 106, and the PDC 108 will settle to a range of value of the count signal CNT that generates a delayed clock signal CKD having positive transitions that occur at substantially the same time as negative transitions of the clock signal CK.

The lock detect circuit 1-110 receives the phase detect signal PHD and the clock signal CK and generates the lock signal LOCK. The lock detect circuit 1-110 generates the lock signal LOCK according to a threshold value and a count of a number of clock cycles of the clock signal CK occurring after a most recent transition of the phase detect signal PHD, as will be described in more detail below.

Figure 3:
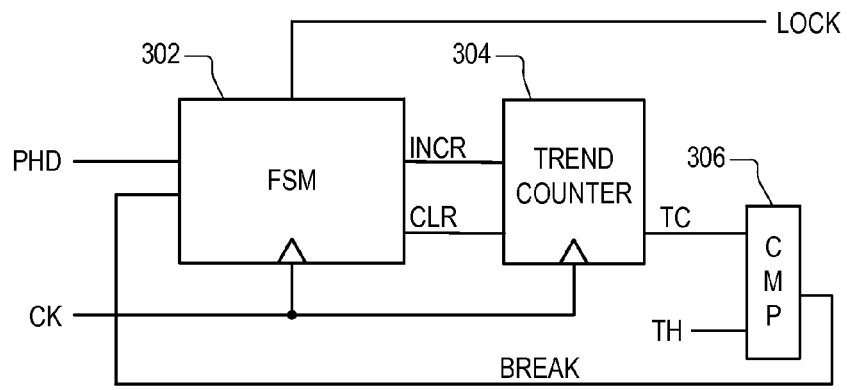
FIG. 3 is a block diagram of a lock detect circuit suitable for use in the DLL of FIG. 1 according to an embodiment.

FIG. 3 is a block diagram of a lock detect circuit 3-110 suitable for use as the lock detect circuit 1-110 of the DLL 100 of FIG. 1 according to an embodiment. The lock detect circuit 3-110 includes a Finite State Machine (FSM) 302, a trend counter 304, and a comparator 306.

The FSM 302 receives a phase detect signal PHD, a clock signal CK, and a break signal BREAK. The FSM 302 produces an increment signal INCR, a clear signal CLR, and a lock signal LOCK, as will be described below.

The trend counter 304 receives the clock signal CK, the increment signal INCR, and the clear signal CLR. The trend counter 304 produces a trend count signal TC. The trend counter 304 sets a value of the trend count signal TC to zero when a positive transition of the clock signal CK occurs and the clear signal CLR has a reset value, and increments the value of the trend count signal TC when the positive transition of the clock signal CK occurs and the increment signal INCR has an increment value. In an embodiment, the trend counter 304 is a two, three, or four bit counter.

The comparator 306 receives the trend count signal TC and a threshold value TH. The comparator 306 generates the break signal BREAK having a high value when a value of the trend count signal TC is greater than or equal to the threshold value TH, and generates the break signal BREAK having a low value when the value of the trend count signal TC is less than the threshold value TH.

The threshold value TH corresponds to a maximum number $N_{MAX}$ of clock cycles of the clock signal CK that may occur after a most recent transition of the phase detect signal PHD without the DLL being considered unlocked, as described below. In an embodiment, the maximum number $N_{MAX}$ is equal to threshold value TH plus an integer constant. In an embodiment, the threshold value TH is programmable.

A person of skill in the art in light of the teachings and disclosures herein would be aware of a variety of respective circuits capable of functioning as the FSM 302, the trend counter 304, and the comparator 306. Furthermore, a person of skill in the art in light of the teachings and disclosures herein would recognize that in an embodiment, a single finite state machine could be configured to perform the functions of the FSM 302 and the trend counter 304.

Figure 4:
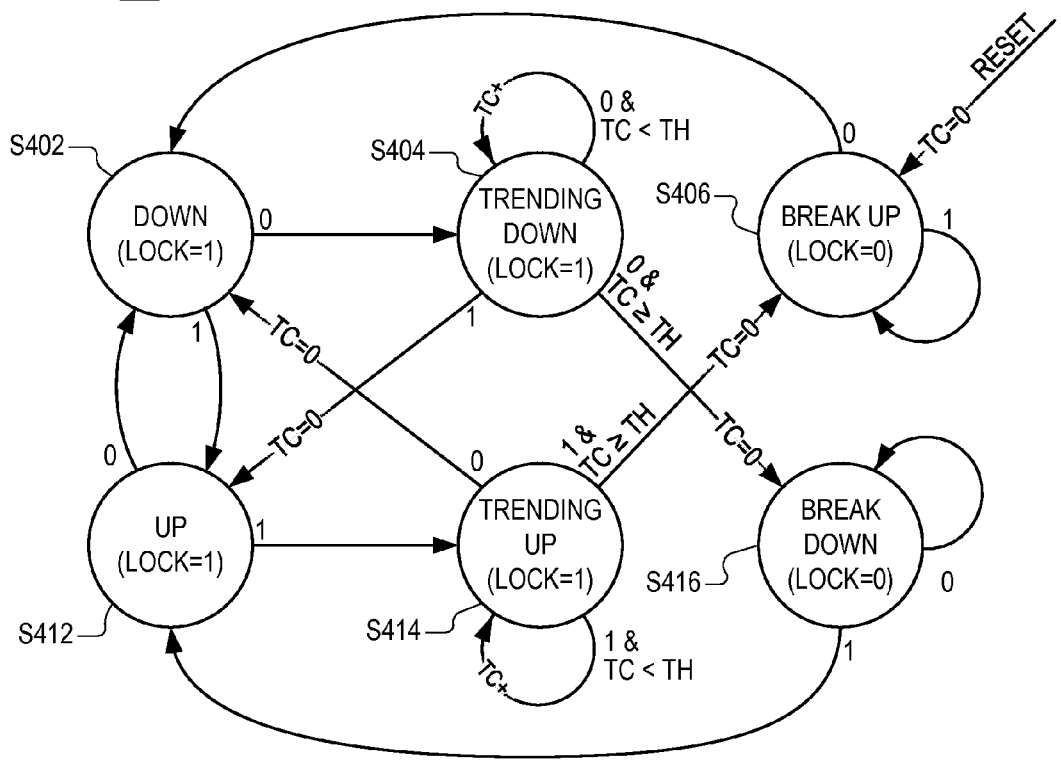
FIG. 4 is a state diagram showing the operation of the lock detect circuit of FIG. 3 according to an embodiment.

FIG. 4 is a state diagram 400 illustrating operations of the lock detect circuit 3-110 of FIG. 3 according to an embodiment.

In particular, the state diagram 400 illustrates a plurality of states of the FSM 302 and transitions between those states.

Each transition is represented as a line with an arrow indicating the destination state of the transition. Text adjacent to the line indicates a condition for performing the transition, with 0 and 1 representing a low and high value of the phase detect signal PHD, respectively, TC representing a value of the trend count signal TC, and TH representing the threshold value TH. Text in the line indicates an operation on the value of the trend count signal TC.

The state diagram 400 includes a down state S402, a trending down state S404, a break up state S406, an up state S412, a trending up state S414, and a break down state S416. The FSM 302 transitions between the states at rising edges of the clock signal CK according to values of the phase detect signal PHD and the break signal BREAK, wherein the break signal BREAK is generated according to a comparison of the value of the trend count signal TC and the threshold value TH.

At a reset of the lock detect circuit 3-110, the phase detect signal PHD has a high value and the FSM 302 resets the trend count signal TC to zero and enters the break up state S406. In an embodiment wherein the phase detect signal PHD has a low value when the reset of the lock detect circuit 3-110 occurs, the FSM 302 resets the trend count signal TC to zero and enters the break down state S416.

The break up state S406 corresponds to the phase detect signal PHD having a high value for a number of clock cycles of the clock CK greater than the threshold value TH. When in the break up state S406, the FSM 302 generates the lock signal LOCK having a low value, transitions to the down state S402 when the phase detect signal PHD has a low value, and remains in the break up state S406 when the phase detect signal PHD has a high value.

The down state S402 corresponds to the phase detect signal PHD having a negative transition during the previous clock cycle of the clock CK. When in the down state S402, the FSM 302 generates the lock signal LOCK having a high value, transitions to the trending down state S404 when the phase detect signal PHD has a low value, and transitions to the up state S412 when the phase detect signal PHD has a high value.

The trending down state S404 corresponds to the phase detect signal PHD having a low value in N immediately preceding clock cycles of the clock CK, where N is greater than one and less than the threshold value TH. When in the trending down state S404, the FSM 302 generates the lock signal LOCK having a high value.

In the trending down state S404, the FSM 302 remains in the trending down state S404 and increments the value of the trend count signal TC when the phase detect signal PHD has a low value and the break signal BREAK has a low value. The break signal BREAK having the low value indicates that the value of the trend count signal TC is less than the threshold value TH. In the embodiment shown in FIG. 3, the FSM 302 increments the value of the trend count signal TC by generating the increment signal INCR having an increment value.

The FSM 302 transitions from the trending down state S404 to the break down state S416 and resets the value of the trend count signal TC to zero when the phase detect signal PHD has a low value and the break signal BREAK has a high value. The break signal BREAK having the high value indicates that the value of the trend count signal TC is greater than or equal to the threshold value TH. In the embodiment shown in FIG. 3, the FSM 302 resets the value of the trend count signal TC to zero by generating the clear signal CLR having the reset value. In another embodiment, the FSM 302 does not reset the value of the trend count signal TC to zero when transitioning from the trending down state S404 to the break down state S416, and instead resets the value of the trend count signal TC to zero when transitioning from the break down state S416 to the up state S412.

The FSM 302 transitions from the trending down state S404 to the up state S412 and resets the value of the trend count signal TC to zero when the phase detect signal PHD has a high value.

The break down state S416 corresponds to the phase detect signal PHD having a low value for a number of clock cycles of the clock CK greater than the threshold value TH. When in the break down state S416, the FSM 302 generates the lock signal LOCK having a low value, transitions to the up state S412 when the phase detect signal PHD has the high value, and remains in the break down state S416 when the phase detect signal PHD has the low value.

The up state S412 corresponds to the phase detect signal PHD having a positive transition during the previous clock cycle of the clock CK. When in the up state S412, the FSM 302 generates the lock signal LOCK having a high value, transitions to the trending up state S414 when the phase detect signal PHD has the high value, and transitions to the down state S402 when the phase detect signal PHD has the low value.

The trending up state S414 corresponds to the phase detect signal PHD having a high value in N immediately preceding clock cycles of the clock CK, where N is greater than one and less than the threshold value TH. When in the trending up state S402, the FSM 302 generates the lock signal LOCK having the high value.

When in the trending up state S414, the FSM 302 remains in the trending up state S414 and increments the value of the trend count signal TC when the phase detect signal PHD has a high value and the break signal BREAK has the low value.

The FSM 302 transitions from the trending up state S414 to the break up state S406 and resets the value of the trend count signal TC to zero when the phase detect signal PHD has a high value and the break signal BREAK has the high value. In another embodiment, the FSM 302 does not reset the value of the trend count signal TC to zero when transitioning from the trending up state S414 to the break up state S406, and instead resets the value of the trend count signal TC to zero when transitioning from the break up state S406 to the down state S402.

The FSM 302 transitions from the trending up state S414 to the down state S402 and resets the value of the trend count signal TC to zero when the phase detect signal PHD has a low value.

Figure 5:
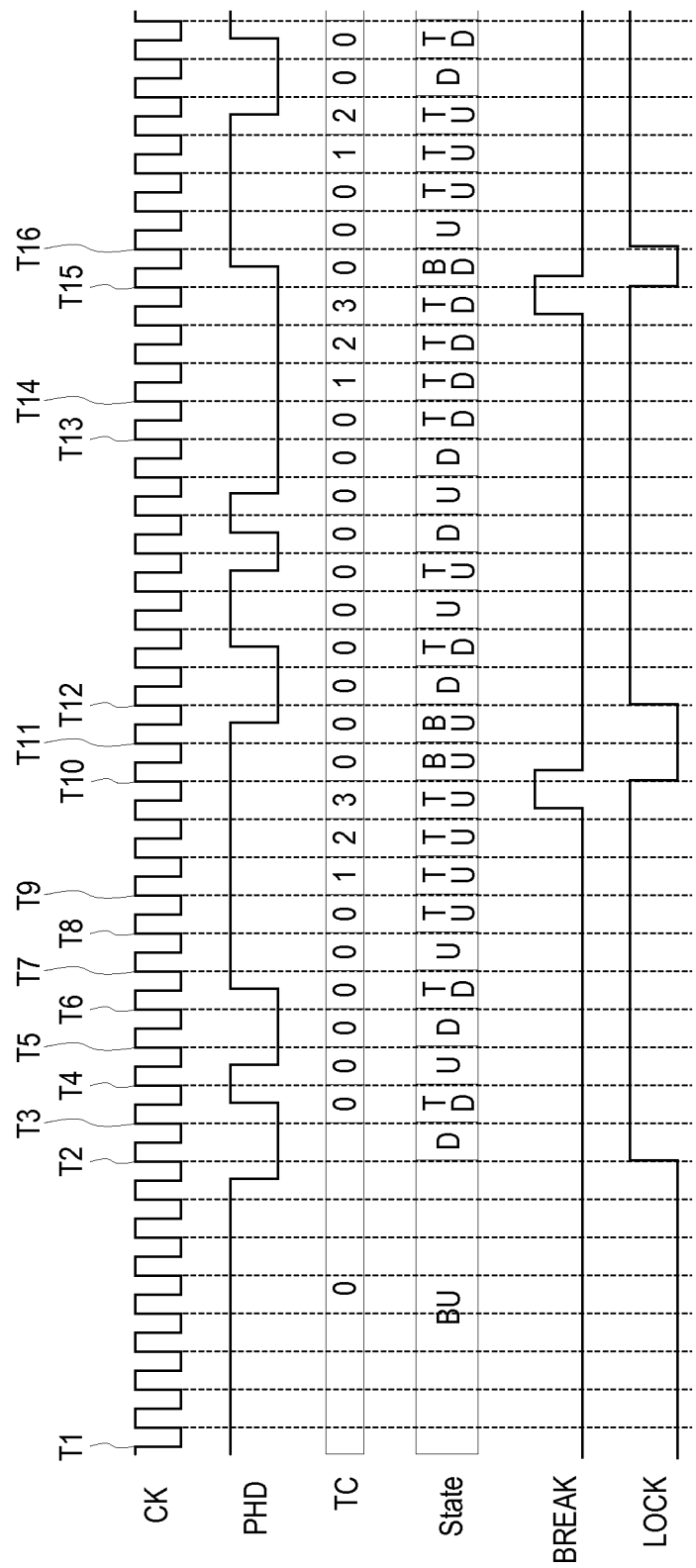
FIG. 5 is a waveform diagram illustrating operations of the lock detect circuit of FIG. 3 according to an embodiment.

FIG. 5 is a waveform diagram illustrating operations of the lock detect circuit 3-110 of FIG. 3 according to an embodiment. In the example illustrated in FIG. 5, the threshold value TH is 3, which in the embodiment of FIG. 3 corresponds to indicating that the DLL is unlocked after 5 consecutive cycles of the clock signal CK in which there is no transition of the phase detect signal PHD.

In FIG. 5, the State line indicates the state that the FSM 302 is in, according to Table 1:

TABLE 1

Symbols Used for States

| Symbol | State |
| --- | --- |
| D | down state S402 |
| TD | trending down state S404 |
| BD | break down state S416 |
| U | up state S412 |
| TU | trending up state S414 |
| BU | break up state S406 |

At a first time T1, the FSM 302 is reset. The FSM 302 enters the break up state S406 and the value of the trend count signal TC is reset to zero. The FSM 302 generates the lock signal LOCK having the low value when in the break up state S406. The lock signal LOCK having the low value indicates that the DLL 100 is unlocked.

In subsequent cycles the phase detect signal PHD has the high value, and the FSM 302 remains in the break up state S406.

At a second time T2, the phase detect signal PHD has the low value. As a result, the FSM 302 transitions from the break up state S406 to the down state S402. The FSM 302 generates the lock signal LOCK having the high value when in the down state S402. The lock signal LOCK having the high value indicates that the DLL 100 is locked.

At a third time T3, the phase detect signal PHD has the low value. As a result, the FSM 302 transitions from the down state S402 to the trending down state S404. The FSM 302 generates the lock signal LOCK having the high value when in the trending down state S404.

At a fourth time T4, the phase detect signal PHD has the high value. As a result, the FSM 302 transitions from the trending down state S404 to the up state S412. The FSM 302 generates the lock signal LOCK having the high value when in the up state S412.

At a fifth time T5, the phase detect signal PHD has the low value. As a result, the FSM 302 transitions from the up state S412 to the down state S402.

At a sixth time T6, the phase detect signal PHD has the low value. As a result, the FSM 302 transitions from the down state S402 to the trending down state S404.

At a seventh time T7, the phase detect signal PHD has the high value. As a result, the FSM 302 transitions from the trending down state S404 to the up state S412.

At an eighth time T8, the phase detect signal PHD has the high value. As a result, the FSM 302 transitions from the up state S412 to the trending up state S414. The FSM 302 generates the lock signal LOCK having the high value when in the trending up state S414.

At a ninth time T9, the phase detect signal PHD has the high value and the break signal BREAK has the low value. The break signal BREAK having the low value indicates that the value of the trend count signal TC is less than the threshold value TH. As a result, the FSM 302 remains in the trending up state S414 and increments the value of the trend count signal TC.

In cycles following the ninth time T9, the phase detect signal PHD has the high value and the break signal BREAK has the low value. As a result, the FSM 302 continues to remain in the trending up state S414 and to increment the value of the trend count signal TC, until a tenth time T10.

At the tenth time T10, the phase detect signal PHD has the high value and the break signal BREAK has the high value. The break signal BREAK having the high value indicates that the value of the trend count signal TC is greater than or equal to the threshold value TH. As a result, the FSM 302 transitions from the trending up state S414 to the break up state S406 and resets the value of the trend count signal TC to zero. The FSM 302 generates the lock signal LOCK having the low value when in the break up state S406.

At an eleventh time T11, the phase detect signal PHD is high, and as a result the FSM 302 remains in the break up state S406.

At a twelfth time T12, the phase detect signal PHD has the low value. As a result, the FSM 302 transitions from the break up state S406 to the down state S402. The FSM 302 generates the lock signal LOCK having the high value when in the down state S402.

At a thirteenth time T13, the phase detect signal PHD has the low value. As a result, the FSM 302 transitions from the down state S402 to the trending down state S404.

At a fourteenth time T14, the phase detect signal PHD has the low value and the break signal BREAK has the low value. As a result, the FSM 302 remains in the trending down state S404 and increments the value of the trend count signal TC.

In cycles following the fourteenth time T14, the phase detect signal PHD has the low value and the break signal BREAK has the low value. As a result, the FSM 302 continues to remain in the trending up state S414 and to increment the value of the trend count signal TC, until a fifteenth time T15.

At the fifteenth time T15, the phase detect signal PHD has the low value and the break signal break BREAK has the high value. As a result, the FSM 302 transitions from the trending down state S404 to the break down state S416 and resets the value of the trend count signal TC to zero. The FSM 302 generates the lock signal LOCK having the low value when in the break down state S416.

At a sixteenth time T16 the phase detect signal PHD has the high value. As a result, the FSM 302 transitions from the break down state S416 to the up state S412. The FSM 302 generates the lock signal LOCK having the high value when in the up state S412.

The operation of the lock detect circuit 3-110 at a time shown in FIG. 5 but not explicitly described herein may be determined according to an operation of the lock detect circuit 3-110 at a time of the first through sixteenth times T1 through T16 having the same values of the state, the phase detect signal PHD, the break signal BREAK, and the trend count signal TC.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus comprising:
   a lock detect circuit configured to receive a phase detect signal and generate a lock signal according to the phase detect signal,
   wherein the lock detect circuit is configured to receive a clock signal and generate the lock signal according to a count of a number of clock cycles of the clock signal since a most recent change in a value of the phase detect signal.

2. The apparatus of claim 1, wherein the phase detect signal is a single bit signal having a first value or a second value.

3. The apparatus of claim 1, wherein the lock detect circuit is configured to generate the lock signal having a first value when the count of the number of clock cycles is less than a threshold value, and
   wherein the lock detect circuit is configured to generate the lock signal having a second value when the count of the number of clock cycles is greater than or equal to the threshold value.

4. The apparatus of claim 3, wherein the threshold value is programmable.

5. The apparatus of claim 1, wherein the lock detect circuit includes:
   a trend counter configured to receive a clock signal and generate a trend count signal using the clock signal;
   a comparator configured to receive the trend count signal, perform a comparison of a value of the trend count signal to a threshold value, and generate a break signal according to the comparison; and
   a finite state machine configured to receive the phase detect signal and the break signal, and to generate a lock signal and control the trend counter according to the phase detect signal and the break signal.

6. The apparatus of claim 5, wherein the value of the trend count signal corresponds to a count of a number of clock cycles of the clock signal since a most recent change in a value of the phase detect signal.

7. The apparatus of claim 5, wherein the trend counter is a one, two, or three bit counter.

8. The apparatus of claim 1, further including a phase detect circuit of a delay locked loop (DLL) circuit configured to generate the phase detect signal.

9. The apparatus of claim 1, wherein the lock detect circuit is provided in an integrated circuit.

10. A method comprising:
    receiving a phase detect signal using a lock detect circuit;
    receiving a clock signal using the lock detect circuit; and
    generating a lock signal according to a count of a number of clock cycles of the clock signal since a most recent change in a value of the phase detect signal.

11. The method of claim 10, wherein the phase detect signal is a single bit signal having a first value or a second value.

12. The method of claim 10, further comprising:
    generating the lock signal having a first value when the count of the number of clock cycles is less than a threshold value; and
    generating the lock signal having a second value when the count of the number of clock cycles is greater than or equal to the threshold value.

13. The method of claim 12, further comprising:
    receiving the threshold value,
    wherein the threshold value is programmable.

14. The method of claim 10, further including:
    receiving a clock signal;
    generating a trend count signal according to the clock signal, the phase detect signal, and a break signal;
    performing a comparison of a value of the trend count signal to a threshold value;
    generating the break signal according to the comparison; and
    generating the lock signal according to the phase detect signal and the break signal.

15. The method of claim 14, wherein the value of the trend count signal corresponds to a count of a number of clock cycles of the clock signal since a most recent change in a value of the phase detect signal.

16. The method of claim 14, wherein the trend counter signal is generated using a one, two, or three bit counter.

17. The method of claim 10, further including receiving the phase detect signal from a phase detect circuit of a delay locked loop (DLL) circuit.

* * * * *